United States Patent
Goel et al.

(10) Patent No.: US 8,566,766 B2
(45) Date of Patent: Oct. 22, 2013

(54) METHOD FOR DETECTING SMALL DELAY DEFECTS

(75) Inventors: Sandeep Kumar Goel, San Jose, CA (US); Saurabh Gupta, Hsin-Chu, IN (US); Wei-Pin Changchien, Taichung (TW); Chin-Chou Liu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 427 days.

(21) Appl. No.: 12/943,379

(22) Filed: Nov. 10, 2010

(65) Prior Publication Data
US 2012/0112763 A1    May 10, 2012

(51) Int. Cl.
*G06F 17/50* (2006.01)

(52) U.S. Cl.
USPC .............. 716/108; 716/111; 716/113

(58) Field of Classification Search
USPC .......... 716/106, 108, 111, 113, 122; 324/621; 714/726, 738
See application file for complete search history.

(56) References Cited

U.S. PATENT DOCUMENTS

| | | | |
|---|---|---|---|
| 6,449,743 B1 * | 9/2002 | Hosokawa | 714/738 |
| 8,136,082 B2 * | 3/2012 | Desineni et al. | 716/136 |
| 8,352,818 B2 * | 1/2013 | Goel et al. | 714/738 |
| 2007/0288822 A1 * | 12/2007 | Lin et al. | 714/741 |
| 2010/0153795 A1 | 6/2010 | Goel et al. | |

* cited by examiner

*Primary Examiner* — Sun Lin
(74) *Attorney, Agent, or Firm* — Slater & Marsil, L.L.P.

(57) ABSTRACT

System and method for effectively detecting small delay defects is disclosed. The method first loads layout information of an integrated circuit. Then, the nets and paths of the integrated circuit are partitioned into two groups based upon their physical information. The physical information comprises the length of each path and net and the number of vias at each path and net. A timing-aware automatic test pattern generator is configured to generate test patterns for the first group having paths and nets susceptible to small delay defects. A traditional transition delay fault test pattern generator is configured to generate test patterns for the second group.

21 Claims, 3 Drawing Sheets

METHOD FOR DETECTING SMALL DELAY DEFECTS

BACKGROUND

Advances in semiconductor design methods and fabrication technologies are leading to a continuous increase in the complexity of Integrated Circuits (ICs). A modern IC not only includes a plurality of transistors, but also operates at a higher clock frequency. These advances such as higher clock frequencies make the modern IC more susceptible to timing related defects, such as Small Delay Defects (SDDs). While an IC designer may design an IC in accordance with its timing specification, due to process variations and manufacture defects, some ICs may still fail the SDD test. Therefore, testing for SDDs is an important step to separate defective chips from non-defective chips.

SDDs involve small delay variations in ICs due to semiconductor fabrication process variations, power supply noise, crosstalk noise and the like. A traditional Transition Delay Fault (TDF) method may not detect SDDS because the delay captured by the TDF method at each logic gate is small and within specifications. However, the cumulative delay at a critical path having a plurality of logic gates in series connection may cause a logic failure. In order to detect a SDD failure in an IC, a least slack time path in the IC is selected to activate the SDD induced fault. The least slack time path may be a long path having a variety of logic gates and wires.

A variety of Automatic Test Pattern Generation (ATPG) methods have been applied to detecting SDDs. Faster-than-at-speed delay tests perform a reliable SDD test at a short path by removing as much of the slack as possible. In other words, the slack at a short path can be removed by increasing the clocking speed of test patterns. Although this method can activate SDDs by removing the slack time in ICs, the higher frequency of this method requires additional design and test constraints, which may be complicated. In addition, this method may reject some good ICs having additional delays which may not cause logic failures in real applications. Furthermore, the higher frequency of this method may increase power consumption to a level exceeding the maximum value to which the IC is specified.

A timing-aware ATPG method is another approach to effectively detect SDDs. Instead of removing the slack time at a short path, the timing-aware ATPG method excites SDDs through long paths. Such a timing-aware method uses timing information of an IC and selects a list of long paths having least slack time, so that the timing-aware ATPG method may have a high possibility of finding SDDs. However, the number of pattern count and run time may increase exponentially as feature sizes of ICs increase. This may slow down the real performance of the timing-aware ATPG method.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a test pattern generation technique for detecting Small Delay Defects (SDDs). The invention may also be applied, however, to a variety of test pattern generation techniques for other types of defects.

Figure 1:
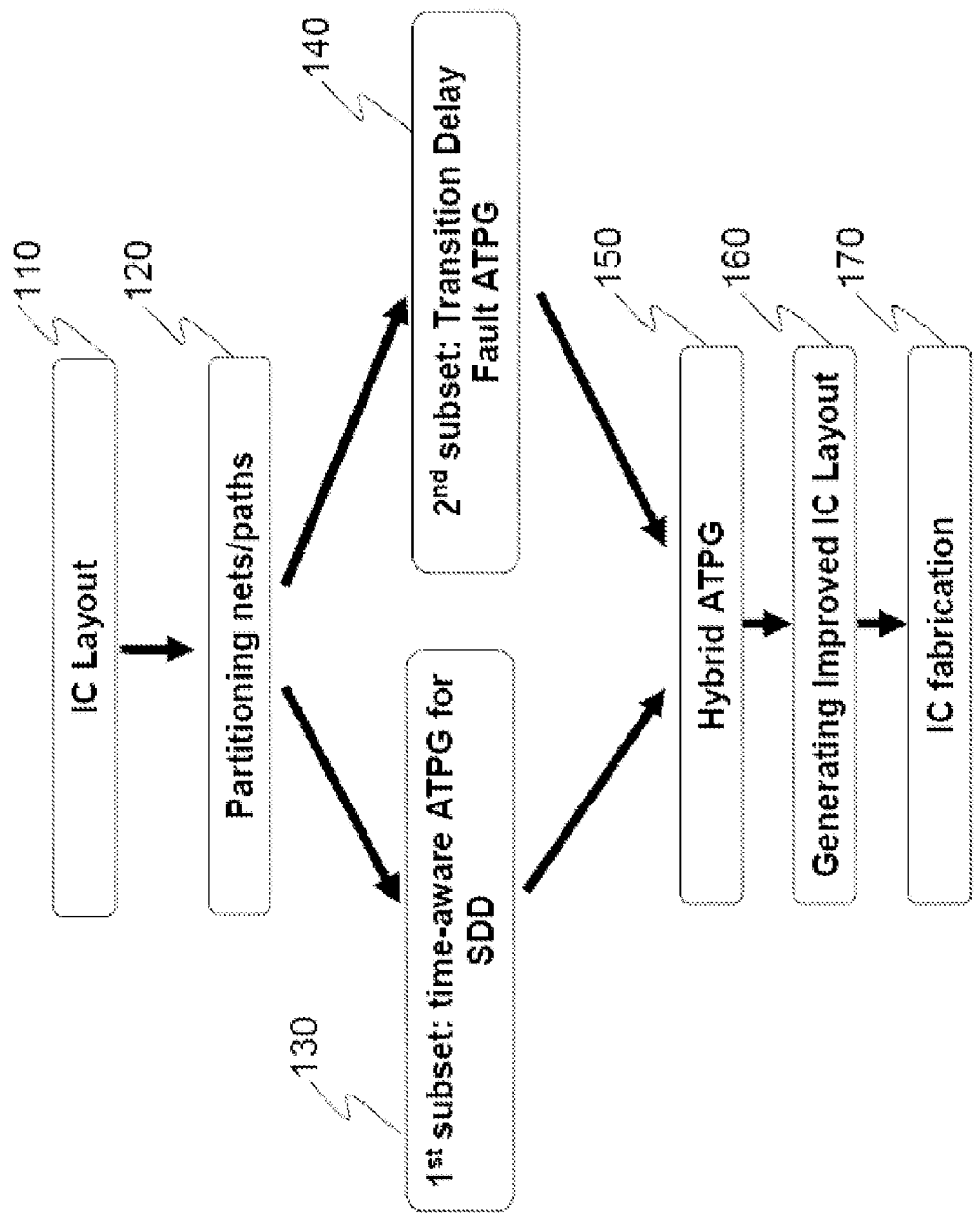
FIG. 1 illustrates a flow chart of generating test patterns for detecting Small Delay Defects (SDDs) based upon a physical-aware Automatic Test Pattern Generation (ATPG) method.

Referring initially to FIG. 1, a flow chart of generating test patterns for detecting SDDs based upon a physical-aware Automatic Test Pattern Generation (ATPG) method. In a step 110, the physical-aware ATPG method loads a layout of an Integrated Circuit (IC) before the IC is sent to the foundry. The layout includes a variety of physical parameters of the IC, such as the number of vias, the distribution of vias, the number of wires, the length of each wire, the connection information of wires and the like. The wires of the IC and logic gates connecting with wires form a plurality of paths and nets. A small delay at each logic gate may not exceed the max delay time to which a logic gate is specified. However, the cumulative delay through a path or a net including a plurality of logic gates may cause a logic failure. Among the plurality of paths and nets, some paths and nets are vulnerable to SDDs due to their physical information such as the length of a path or the number of vias punched through the surface of the path. In accordance with an embodiment, approximately 70% of paths or nets of an IC are unique in consideration of their physical information. Therefore, the paths and nets of an IC can be classified into a plurality of groups based upon their unique physical information.

In a step 120, the paths and nets of an IC are divided into at least two groups according to a method, which will be described in detail with respect to FIG. 2. It should be noted that while FIG. 1 illustrates that the paths and nets of an IC are divided into two groups, the paths and nets of an IC may be divided into a variety of groups in view of their physical information. The number of groups illustrated herein is limited solely for the purpose of clearly illustrating the inventive aspects of the various embodiments. The present invention is not limited to any specific number of groups divided from an IC.

In a step 130, the first group includes a plurality of paths and nets susceptible to SDDs. A test pattern set having a high coverage of SDDs is applied to the first group. In an embodiment, the test pattern set having a high coverage of SDDs may be implemented by a timing-aware ATPG method. In a step 140, the paths and nets in the second group is determined to be not vulnerable to SDDs (as will be described below). A traditional test pattern set is applied to the second group. According to an embodiment, the traditional test pattern set may be implemented by a Transition Delay Fault (TDF) ATPG method. By dividing an IC into two groups and applying different ATPG methods, the proposed method can achieve a high coverage of SDDs as well as an efficient SDDs test solution.

In a step 150, the first test pattern set and the second test pattern set are merged into a single hybrid test pattern set. The hybrid test pattern set includes two subsets. One subset is designed for detecting SDDs in critical and vulnerable paths and nets. Therefore, some ATPG methods having a high coverage of SDDs but time-consuming are selected to generate test patterns for this subset. Another subset is designed for detecting SDDS in the rest of paths and nets, which are not susceptible to SDDs. A traditional ATPG method may be adopted because it can provide an efficient test solution. By employing this hybrid test pattern set, the proposed method can fully utilize the advantages of the timing-aware ATPG method and the TDF ATPG method.

In a step 160, after the nets and paths having SDDs have been identified, the designer of the IC modifies the design and generates an improved IC layout accordingly. One advantageous feature of this method is that it can save fabrication costs and time by identifying nets and paths susceptible to SDDs during the layout stage. It should be noted the process of identifying nets and paths susceptible to SDDs can be repeated again based upon the newly modified layout. After a layout is known to have minimal impact from SDDs, in a step 170, the IC layout is released to manufacturing.

FIG. 1 is a simplified diagram illustrating the operation of the physical-aware ATPG method according to an embodiment of the present invention. This diagram is merely an example, which should not unduly limit the scope of the claims. One of ordinary skill in the art would recognize many variations, alternatives, and modifications. For example, various step as illustrated in FIG. 1 may added, removed, replaced, rearranged, repeated, overlapped, and/or partially overlapped. Merely as an example, the process as shown in FIG. 1 may be practiced using the system illustrated according to FIG. 3.

Figure 2:
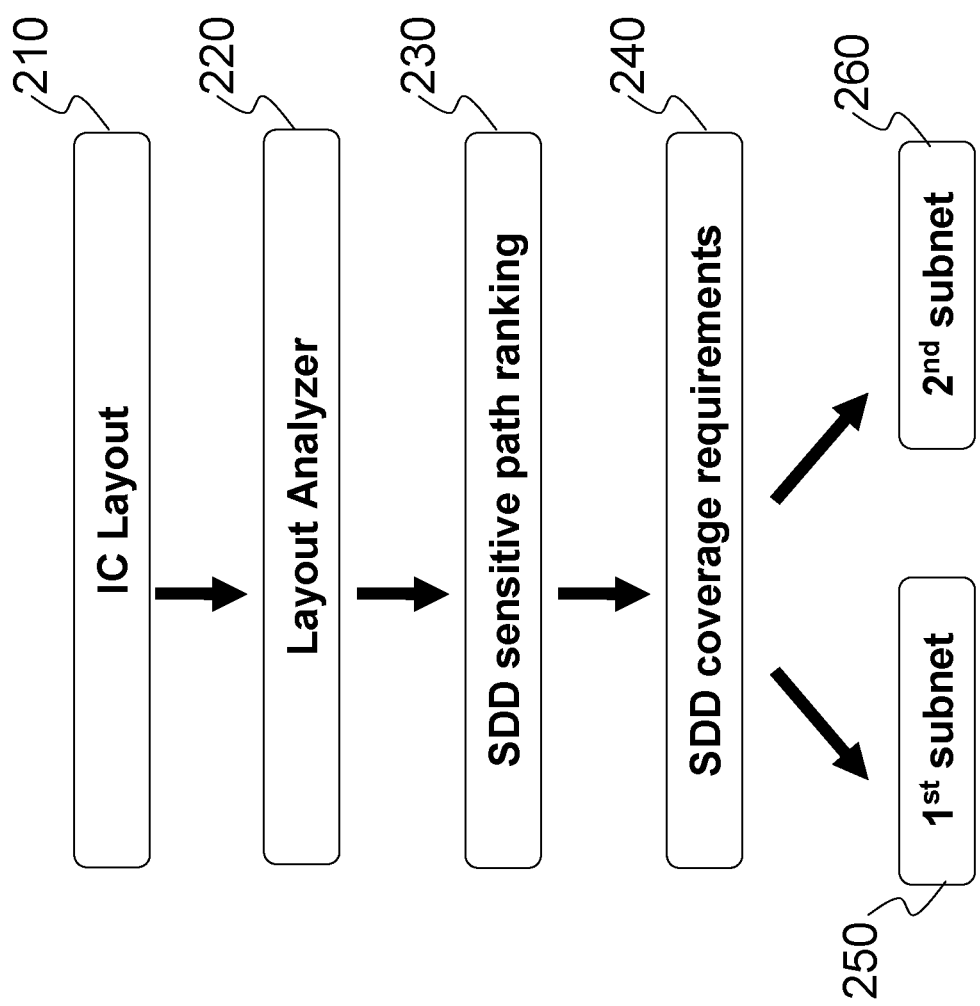
FIG. 2 illustrates a flow chart of partitioning a plurality of nets of a chip into two sub-groups.

FIG. 2 illustrates a flow chart of partitioning a plurality of nets of a chip into two sub-groups. In a step 210, an IC layout has been completed. Before the layout information is converted into a format for semiconductor fabrication processes, the IC layout is sent to a layout analyzer shown in a step 220. The layout analyzer collects physical information of this IC from the IC layout. The physical information comprises the total possible paths and nets in the IC, the length of each path and net, the number of via holes at each path and net, net spacing, layout position, proximity to power/ground lines or the like.

According to an embodiment, the length of each path/net and the number of vias at each path/net are two physical parameters used to find the paths and nets, which are susceptible to SDDs. It should be noted that the length and the number of vias are selected purely for demonstration purposes and are not intended to limit the various embodiments of the present invention. Other physical characteristics such as net spacing, layout position and proximity to power/ground lines can also be used to find the paths and nets, which are susceptible to SDDs.

In a step 230, the susceptibility to SDDs of each path/net is assessed by calculating the total impact of two physical parameters described above. For example, in consideration of past characterization data of SDDs, different weighting factors are assigned to these two physical parameters. After a normalization process, the normalized impact from the number of vias and the normalized impact from the length are added together to be a sum. The sum represents a SDD suspect index. Based upon such an index, all paths and nets are ranked from high to low. A path/net ranked high means this path/net is vulnerable to SDDs. By contrast, a path/net ranked low means this part/net is likely free from SDDs.

In a step 240, in consideration of the SDD specification of an IC and past characterization data of SDDs, the paths and nets of the IC is divided into two groups. For example, from past characterization data of SDDs, testing N paths/nets with the timing-aware ATPG method from an IC having M paths/nets may meet the specification that SDDs percentage is below a max value to which the IC is specified. Then, the paths and nets ranked from the first to the Nth are selected according to their suspect index. In a step 250, paths and nets ranked from the first to the Nth are sent to a first group. The rest of paths and nets are grouped and sent to a second group in a step 260.

It should be noted that FIG. 2 illustrates only two sub-groups of a chip that may be partitioned into a variety of sub-groups. The number of sub-groups illustrated herein is limited solely for the purpose of clearly illustrating the inventive aspects of the various embodiments. The present invention is not limited to any specific number of sub-groups.

Figure 3:
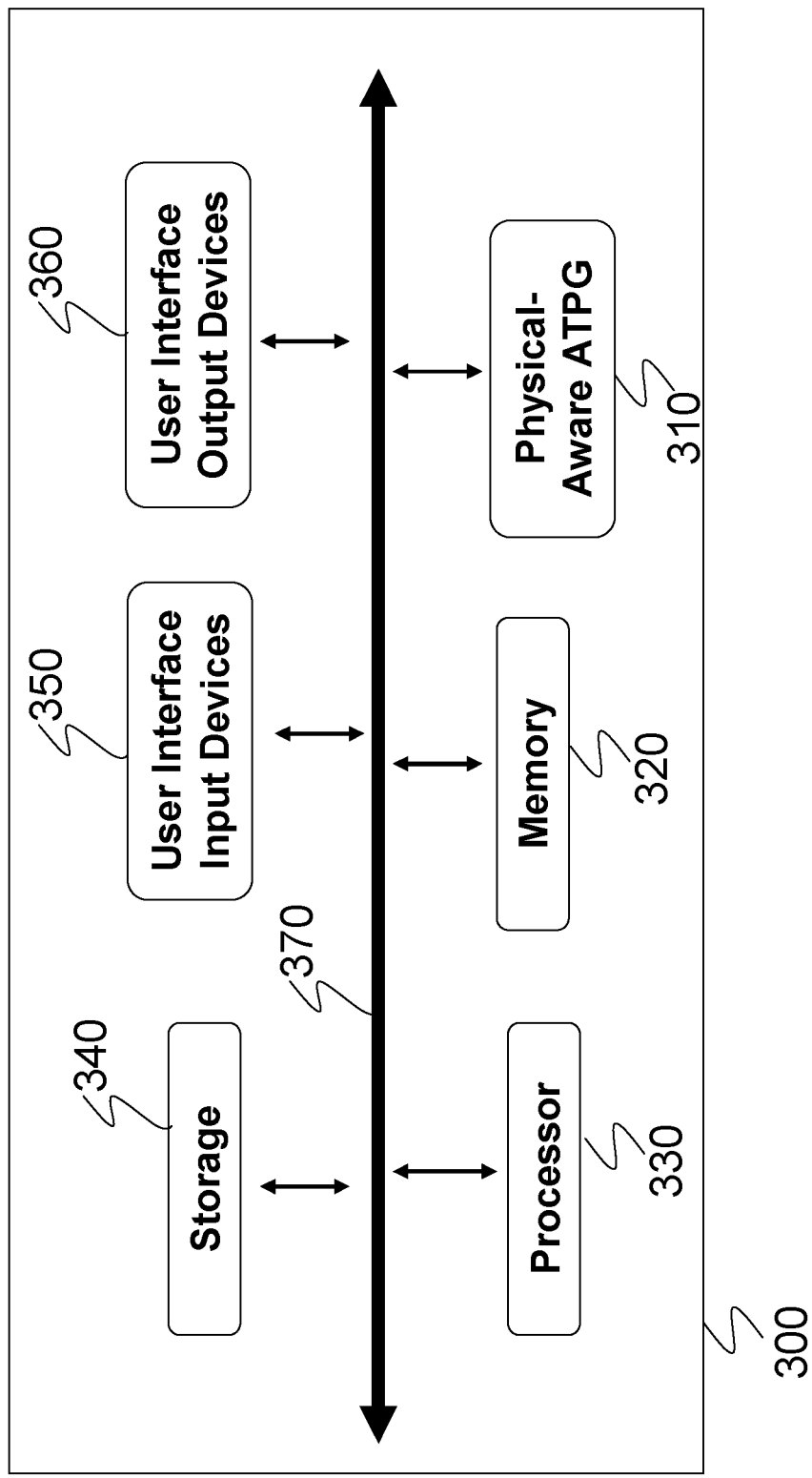
FIG. 3 illustrates a simplified block diagram of a computer system that can be used to implement physical-aware ATPG method in accordance with an embodiment.

FIG. 3 illustrates a simplified block diagram of a computer system 300 that can be used to implement physical-aware ATPG method in accordance with an embodiment. The computer system 300 includes a physical-aware ATPG unit 310, a memory 320, a processor 330, a storage unit 340, user interface input devices 350, user interface output devices 360 and a data bus 370. It should be noted that this diagram is merely an example of a personal computer, which should not unduly limit the scope of the claims. Many other configurations of a personal computer are within the scope of this disclosure. One of ordinary skill in the art would also recognize the physical-aware ATPG method may be performed by other computer systems including a portable computer, a workstation, a network computer, or the like.

The physical-aware ATPG unit 310 may be a physical device, a software program, or a combination of software and hardware such as Application Specific Integrated Circuits (ASIC). In accordance with an embodiment, when a user launches the physical-aware ATPG method through the user interface input devices 350, the processor 330 loads layout information and other relevant data from the storage unit 340. According to an embodiment, the physical-aware ATPG method is implemented as a software program, the process 330 loads the software program from the physical-aware ATPG unit 310 and operates it in the memory 320. After the processor 330 performs each step of FIGS. 1 and 2, the processor 330 sends the hybrid test patterns to the user interface output devices 360. In accordance with the hybrid test patterns, dedicated test equipment is employed to conduct tests so as to find ICs having small delay defects.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for detecting small delay defects in an integrated circuit layout comprising:
   loading an integrated circuit layout through a processor;
   measuring a length of each path or net of the integrated circuit layout;
   counting a number of vias electrically coupled to each path or net;
   calculating an index for each path or net based upon the length and the number of vias of each path or net;
   ranking each path or net in a list based upon the index; and
   forming a first group and a second group of paths or nets in the integrated circuit layout.

2. The method of claim 1, further comprising a normalization process wherein a first impact is normalized from the length of each path or net and a second impact is normalized from the number of vias of each path or net.

3. The method of claim 2, wherein a sum of the first impact and the second impact is the index.

4. The method of claim 1, further comprising forming a third group having a plurality of paths or nets by splitting the third group from either the first group or the second group.

5. The method of claim 1, wherein the calculating an index for each path or net based upon the length of each path or net and the number of vias of each path or net comprises:
   receiving a first weighting factor and a second weighting factor;
   modifying an impact of the length of each path or net based upon the first weighting factor;
   modifying an impact of the number of vias of each path or net based upon the second weighting factor; and
   calculating the index.

6. The method of claim 1, wherein the first group includes N paths or nets ranked from a first position to an Nth position in the list and the second group includes paths or nets ranked from an (N+1)th position to a last position in the list.

7. The method of claim 1, further comprising measuring a parameter of the integrated circuit layout and calculating the index for each path or net based upon the length, the number of vias of each path or net and the parameter.

8. The method of claim 7, wherein the parameter is selected from a group consisting of net spacing, layout position, proximity to power/ground lines and any combination thereof.

9. A method for detecting small delay defects in an integrated circuit layout comprising:
   loading an integrated circuit layout through a processor;
   partitioning a plurality of paths or nets of the integrated circuit layout; wherein the partitioning the plurality of paths or nets of the integrated circuit layout comprises:
      measuring a length of each path or net of the integrated circuit layout;
      counting a number of vias electrically coupled to each path or net;
      calculating an index for each path or net based upon the length and the number of vias of each path or net;
      ranking each path or net in a list based upon the index; and
      forming a first group and a second group of paths or nets in the integrated circuit layout;
   generating first test patterns for the first group;
   generating second test patterns for the second group; and
   merging the first test patterns and the second test patterns.

10. The method of claim 9, wherein the first test patterns are generated from a timing-aware automatic test pattern generation method.

11. The method of claim 9, wherein the second test patterns are generated from a transition delay fault test pattern generation method.

12. The method of claim 9, further comprising forming a third group having a plurality of paths or nets by splitting the third group from either the first group or the second group.

13. The method of claim 12, wherein third test patterns are generated for the third group from a traditional automatic test pattern generation method.

14. The method of claim 9, wherein the partitioning a plurality of paths or nets of the integrated circuit layout further comprises:
   receiving an integer K; and
   dividing nets or paths of the integrated circuit into K groups.

15. The method of claim 14, wherein each group of the K groups has its own test patterns.

16. The method of claim 15, wherein the test patterns are generated from an automatic test pattern generation method.

17. A non-transitory computer readable medium containing an executable test pattern generation program for causing a computer to detect small delay defects in an integrated circuit layout, the computer comprising a plurality of elements, the elements including a processor, a memory, a physical-aware automatic test pattern generation unit, a storage unit, user interface input devices and user interface output devices, where the program causes the computer to perform the step of:
   loading an integrated circuit layout;
   partitioning a plurality of paths or nets of the integrated circuit layout; wherein the partitioning further comprises:
      measuring a length of each path or net of the integrated circuit layout;
      counting a number of vias electrically coupled to each path or net;
      calculating an index for each path or net based upon the length and the number of vias of each path or net;
      ranking each path or net in a list based upon the index; and
      forming a first group and a second group of the plurality of paths or nets;
   generating first test patterns for the first group;
   generating second test patterns for the second group; and
   merging the first test patterns and the second test patterns.

18. The non-transitory computer readable medium of claim 17, wherein the first test patterns are generated from a timing-aware automatic test pattern generation method.

19. The non-transitory computer readable medium of claim 17, wherein the second test patterns are generated from a transition delay fault test pattern generation method.

20. The non-transitory computer readable medium of claim 17, further comprising forming a third group having a plurality of paths or nets by splitting the third group from either the first group or the second group.

21. The non-transitory computer readable medium of claim 17, wherein the physical-aware automatic test pattern generation unit is selected from a group consisting of a software program, a hardware device, and a combination of a software program and a hardware device.

* * * * *